United States Patent
Bains et al.

(10) Patent No.: US 8,196,009 B2
(45) Date of Patent: Jun. 5, 2012

(54) SYSTEMS, METHODS, AND APPARATUSES TO TRANSFER DATA AND DATA MASK BITS IN A COMMON FRAME WITH A SHARED ERROR BIT CODE

(75) Inventors: Kuljit S. Bains, Olympia, WA (US); Dennis W. Brzezinski, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 1020 days.

(21) Appl. No.: 12/141,339

(22) Filed: Jun. 18, 2008

(65) Prior Publication Data

US 2009/0319877 A1    Dec. 24, 2009

(51) Int. Cl.
*H03M 13/00* (2006.01)
(52) U.S. Cl. .......................... 714/758; 714/807
(58) Field of Classification Search .......... 714/763, 714/799, 807, 758
See application file for complete search history.

(56) References Cited

U.S. PATENT DOCUMENTS

| | | | |
|---|---|---|---|
| 2002/0040429 A1* | 4/2002 | Dowling | 712/228 |
| 2003/0156465 A1 | 8/2003 | Laberge | |
| 2007/0061671 A1 | 3/2007 | Wallner et al. | |
| 2008/0065851 A1* | 3/2008 | Balb et al. | 711/165 |

FOREIGN PATENT DOCUMENTS

| | | |
|---|---|---|
| WO | WO-2006122932 | 11/2006 |
| WO | WO-2008005781 | 1/2008 |

OTHER PUBLICATIONS

Office Action for European Patent Application No. 09 251 583.2-2210 mailed Nov. 16, 2009, 4 pgs.
Notice of Preliminary Rejection for Korean Patent Application No. 10-2009-54352 mailed Dec. 24, 2010, 2 pgs.
Notice of Preliminary Rejection for Korean Patent Application No. 10-2009-54352 mailed Jan. 17, 2011, 11 pgs.

* cited by examiner

*Primary Examiner* — Guy Lamarre
(74) *Attorney, Agent, or Firm* — Blakely, Sokoloff, Taylor & Zafman LLP

(57) ABSTRACT

Embodiments of the invention are generally directed to systems, methods, and apparatuses to transfer data and data mask bits in a common frame with a shared error bit code. A memory system uses data frames to transfer data between a host and a memory device. In some cases, the system may also transfer one or more data mask bits in a data frame (rather than via a separate bit lane). The system may generate an error bit checksum (such as a cyclic redundancy code or CRC) to cover the data bits and the data mask bits. In some embodiments, the data bits, data mask bits, and checksum bits are transferred in a common frame.

29 Claims, 7 Drawing Sheets

| Transfer | | | | | | | | | |
|---|---|---|---|---|---|---|---|---|---|
| 0 | 1 | 2 | 3 | 4 | 5 | 6 | 7 | 8 | 9 |
| q63 | q48 | q47 | q32 | q31 | q16 | q15 | q0 | CRC 0 | DM0 |
| q62 | q49 | q46 | q33 | q30 | q17 | q14 | q1 | CRC 1 | DM1 |
| q61 | q50 | q45 | q34 | q29 | q18 | q13 | q2 | CRC 2 | DM2 |
| q60 | q51 | q44 | q35 | q28 | q19 | q12 | q3 | CRC 3 | DM3 |
| q59 | q52 | q43 | q36 | q27 | q20 | q11 | q4 | CRC 4 | DM4 |
| q58 | q53 | q42 | q37 | q26 | q21 | q10 | q5 | CRC 5 | DM5 |
| q57 | q54 | q41 | q38 | q25 | q22 | q9 | q6 | CRC 6 | DM6 |
| q56 | q55 | q40 | q39 | q24 | q23 | q8 | q7 | CRC 7 | DM7 |

| Transfer | 0 | 1 | 2 | 3 | 4 | 5 | 6 | 7 | 8 | 9 | |
|---|---|---|---|---|---|---|---|---|---|---|---|
| | q31 | q24 | q23 | q16 | q15 | q8 | q7 | q0 | CRC 0 | CRC 4 | DQ0 |
| | q30 | q25 | q22 | q17 | q14 | q9 | q6 | q1 | CRC 1 | CRC 5 | DQ1 |
| | q29 | q26 | q21 | q18 | q13 | q10 | q5 | q2 | CRC 2 | CRC 6 | DQ2 |
| | q28 | q27 | q20 | q19 | q12 | q11 | q4 | q3 | CRC 3 | CRC 7 | DQ3 |

SYSTEMS, METHODS, AND APPARATUSES TO TRANSFER DATA AND DATA MASK BITS IN A COMMON FRAME WITH A SHARED ERROR BIT CODE

TECHNICAL FIELD

Embodiments of the invention generally relate to the field of integrated circuits and, more particularly, to systems, methods and apparatuses to transfer data and data mask bits in a common frame with a shared error bit code.

BACKGROUND

Memory systems may use a partial write command to indicate that at least some of the transferred data is to be masked. The conventional approach to implementing partial writes includes the use of a dedicated data mask pin. For example, a system may include a dedicated data mask pin for each byte lane of data. Thus, a ×16 wide device typically includes two dedicated data mask pins. The data mask pins are typically toggled at the same frequency as the data signals. In many cases, ×4 devices do not support data masking because they are primarily used in servers that have error correction code (ECC) and perform a "read-modify-write" operation.

In addition, the rate at which information is transferred in memory systems continues to increase. These faster transfer rates dictate the use of mechanisms for improved error coverage. Conventional approaches to improving error coverage involve adding pins to the channel. In modern memory systems, the dynamic random memory access (DRAM) channel is pin constrained. Thus, conventional approaches to improving error coverage are not suitable for modern memory systems.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 3 illustrates a more detailed bit mapping of a ×8 frame according to an embodiment of the invention.

FIG. 4 illustrates selected aspects of a ×4 frame with cyclic redundancy code bits, according to an embodiment of the invention.

DETAILED DESCRIPTION

Embodiments of the invention are generally directed to systems, methods, and apparatuses to transfer data and data mask bits in a common frame with a shared error bit code. A memory system uses data frames to transfer data between a host and a memory device. In some cases, the system may also transfer one or more data mask bits in a data frame (rather than via a separate bit lane). In some embodiments, the system generates an error bit checksum (such as a cyclic redundancy code or CRC) to cover the data bits and the data mask bits. As is further described below, in some embodiments, the data bits, data mask bits, and checksum bits are transferred in a common frame.

Embodiments of the invention are described below in which CRC is used to provide error coverage for transmission errors. It is to be appreciated, however, that in alternative embodiments a different error bit mechanism may be used. For example, in alternative embodiments, parity bits, error correction code, and the like may be used to provide coverage for transmission errors. The term "error bit" (e.g., a CRC bit) refers to a bit that provides error coverage for one or more data bits.

Figure 1:
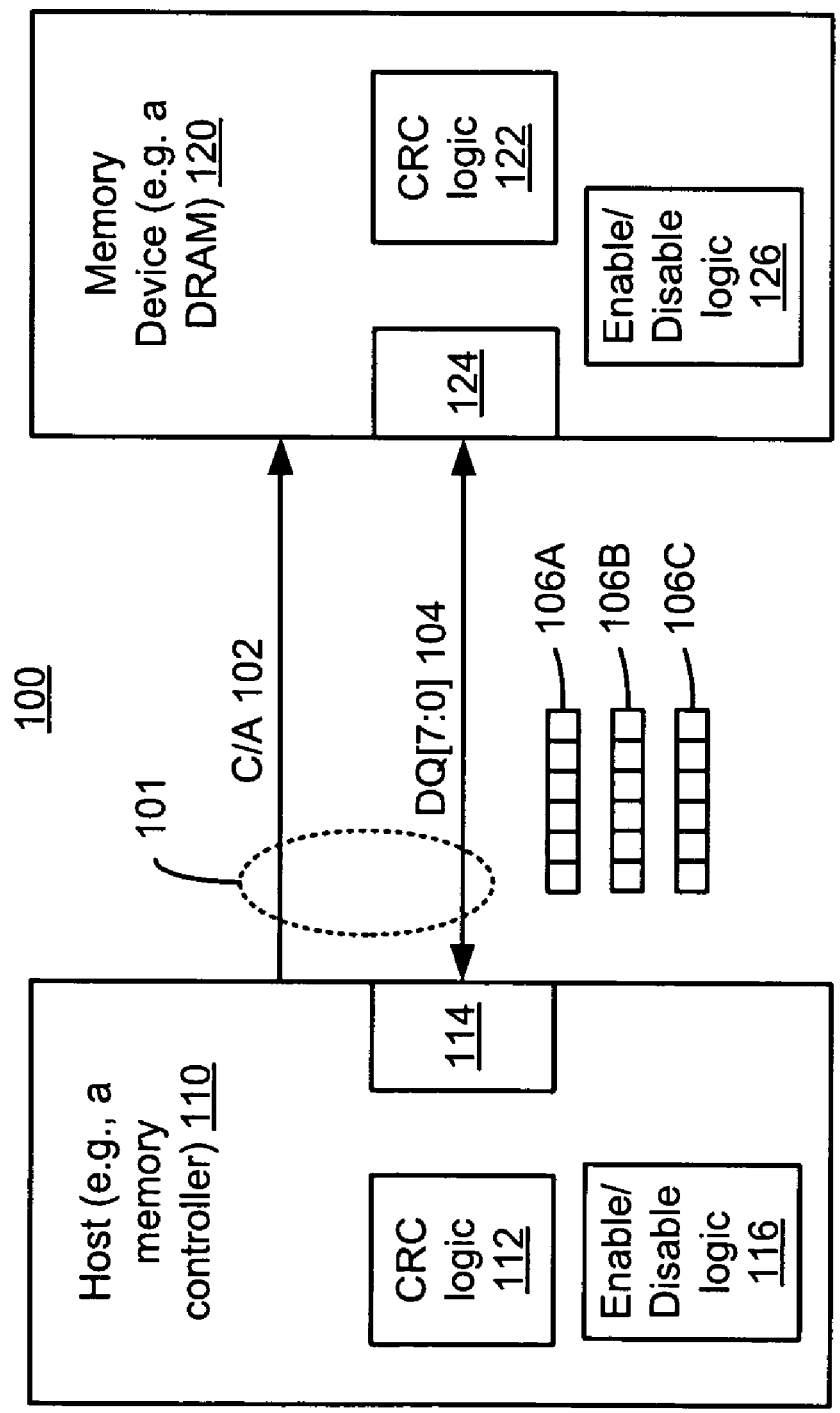
FIG. 1 is a high-level block diagram illustrating selected aspects of a computing system implemented according to an embodiment of the invention.

FIG. 1 is a high-level block diagram illustrating selected aspects of a computing system implemented according to an embodiment of the invention. In the illustrated embodiment, system 100 includes host 110 (e.g., a memory controller) and memory device 120 (e.g., a DRAM). In alternative embodiments, system 100 may include more elements, fewer elements, and/or different elements.

Interconnect 101 links host 110 with memory device 120. In some embodiments, interconnect 101 is (at least partly) a point to point interconnect. In other embodiments, interconnect 101 is (at least partly) a multi-drop bus. In some embodiments, interconnect 101 complies, at least in part, with one or more of the standards and/or specifications that define the double data rate bus (e.g., DDR1, DDR2, DDR3, DDR4, and the like). In the illustrated embodiment, interconnect 101 includes command/address lanes 102 and data (or DQ) lanes 104. In other embodiments, interconnect 101 may include more elements, fewer elements, and/or different elements.

Command/Address (C/A) lanes 102 provide a plurality of lanes for sending commands and addresses to memory device 120. DQ lanes 104 provide a bi-directional read/write data bus. In alternative embodiments, DQ lanes 104 may be uni-directional. For ease of description, embodiments of the invention are described with reference to a ×8 memory device. It is to be appreciated, however, that embodiments of the invention may include other device data widths such as ×4, ×16, ×32, etc.

Host 110 controls the transfer of data to and from memory device 120. In some embodiments, host 110 is integrated onto the same die as one or more processors. In other embodiments, host 110 is part of a computing system's chipset. Host 110 may use a variety of commands to control the transfer of data. For example, the command encoding for a full write may be defined as "W." In some embodiments, host 110 supports a command for partial writes (e.g., Wm). A partial write refers to a write operation in which at least some of the write data is masked using one or more data mask bits. In some embodiments, the data mask bits are transferred in the same frame as the corresponding data bits.

Host 110 includes, inter alia, CRC logic 112, framing logic 114, and enable/disable logic 116. CRC logic 112 enables host 110 to support an in-band CRC mechanism. For example, CRC logic 112 enables host 110 to generate a CRC checksum that is transferred in one or more data frames (e.g., over DQ lanes 104). In some embodiments, a CRC checksum may be generated for partial write frames. The CRC checksum may cover (at least some of) the data bits and (at least some of) the data mask bits in the write frame. In some embodiments, the data bits, data mask bits, and corresponding checksum are transferred in a common frame (e.g., over DQ lanes 104).

In some embodiments, the use of CRC to cover data frames can be selectively enabled or disabled. For example, in the illustrated embodiment, host 110 includes enable/disable logic 116 to selectively enable or disable the use of CRC. In some embodiments, enable/disable logic 116 may include one or more register bits (e.g., mode register set or MRS bits).

Host 110 may also include framing logic 114. Framing logic 114 includes logic to assemble the frames that are transferred to memory device 120. Similarly, logic 114 may also include logic to disassemble the frames that are received from memory device 120. In some embodiments, framing logic 114 is capable of assembling more than one type of data frame (e.g. data frames 106A, 106B, and 106C). Table 1 illustrates three example frame types according to some embodiments of the invention. It is to be appreciated that in alternative embodiments, other frame types may be used.

TABLE 1

| Frame Type | Description | Example Use |
| --- | --- | --- |
| 1 | CRC8 over 72 bits | x8 for 64 data bits + 8 mask bits |
| 2 | CRC8 over 64 bits | x8 for 64 data bits |
| 3 | CRC8 over 32 bits | x4 for 32 data bits |

Memory device 120 provides (at least in part) the main system memory for system 100. In some embodiments, memory device 120 is a DRAM device (e.g., DDR1, DDR2, DDR3, DDR4, etc.). Memory device 120 includes CRC logic 122, framing logic 124, and enable disable logic 126. In some embodiments, CRC logic 122 enables memory device 120 to support an in-band CRC mechanism (e.g., on DQ lines 104). The term "in-band CRC mechanism" refers to supporting CRC (or other error bit scheme) without adding additional pins. CRC logic 122 may include CRC generation logic to generate a local checksum based on a received data frame. The local checksum may be compared with the checksum conveyed in the frame to determine whether there are any transmission errors. Memory device 120 may signal host 110 when transmission errors occur.

Framing logic 124 includes logic to assemble the frames that are transferred from host 110. Logic 124 may also include logic to disassemble the frames that are received from host 110. In some embodiments, framing logic 124 is capable of assembling more than one type of data frame (e.g. data frames 106).

In some embodiments, the use of CRC to cover data frames can be selectively enabled or disabled. For example, in the illustrated embodiment, memory device 120 includes enable/disable logic 126 to selectively enable or disable the use of CRC. In some embodiments, enable/disable logic 126 may include one or more register bits (e.g., mode register set or MRS bits).

Figure 2:
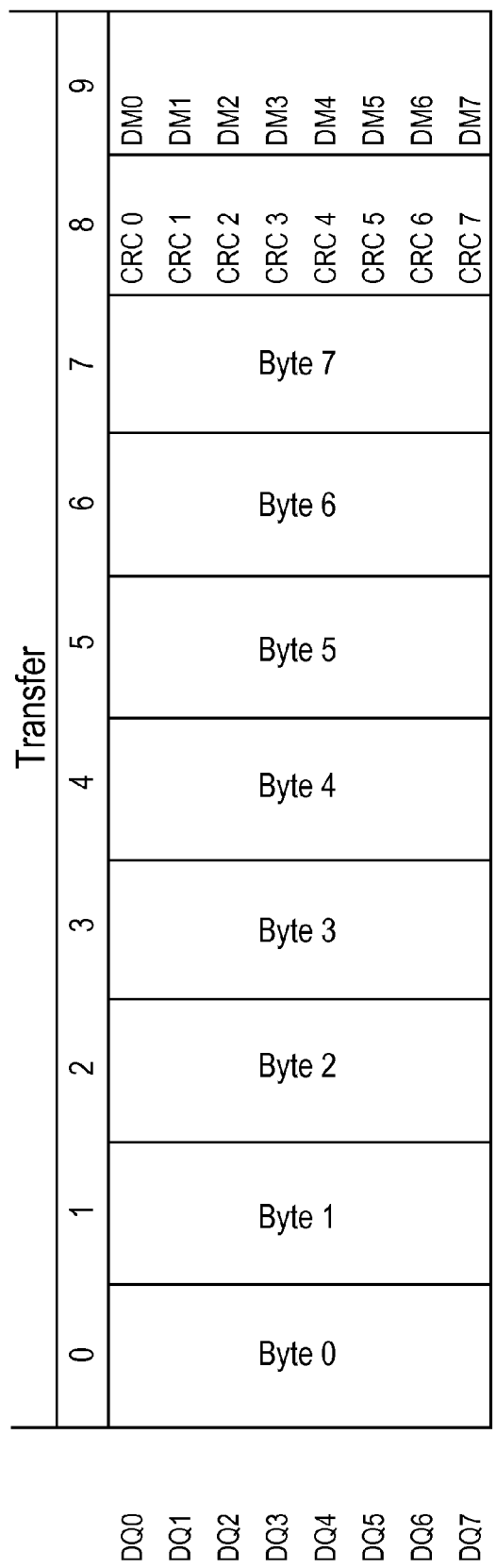
FIG. 2 illustrates selected aspects of a ×8 write frame with data mask bits and cyclic redundancy code bits, according to an embodiment of the invention.

FIG. 2 illustrates selected aspects of a x8 write frame with data mask and cyclic redundancy code bits, according to an embodiment of the invention. Write data frame 200 illustrates a frame of data being written to memory. In the illustrated embodiment, CRC is enabled and frame 200 is a partial write frame (e.g., it includes data mask bits). The first eight UI convey write data (e.g., UI0 through UI7). Unit interval 8 conveys the CRC bits (e.g., a CRC byte in the illustrated embodiment). In some embodiments, the CRC byte covers the data bytes (UI0 through UI7) as well as the data mask byte (e.g., UI9). Unit interval 9 conveys the data mask bits that determine which data bytes are masked. In some embodiments, each data mask bit determines whether the data byte with the corresponding number is masked (e.g., DM0 indicates whether byte 0 is masked, DM1 indicates whether byte 1 is masked, etc.). Table 1 lists the associations between data mask bits and write data bytes according to some embodiments of the invention. In alternative embodiments, the associations between data mask bits and write data bytes (or bits, nibbles, etc.) may be different.

TABLE 2

| Data Mask Bit | Byte Covered by the Data Mask Bit |
| --- | --- |
| DM0 | Byte 0 |
| DM1 | Byte 1 |
| DM2 | Byte 2 |
| DM3 | Byte 3 |
| DM4 | Byte 4 |
| DM5 | Byte 5 |
| DM6 | Byte 6 |
| DM7 | Byte 7 |

FIG. 3 illustrates a more detailed bit mapping of a x8 frame according to an embodiment of the invention. Like frame 200, frame 300 conveys data bits in the first eight UI (UI0 through UI7). It also conveys CRC bits in UI 8 and data mask bits in UI 9. The data bits in frame 300 are mapped in a serpentine pattern across the columns of frame 300 to increase the effectives of the coverage provided by the CRC bits. For example, in UI7 the bit at the bottom of the column (in lane DQ7) is q7. The next bit in the sequence, q8, is located at the bottom of the column defined by UI6. The bit at the top of the same column is q15. The next bit in the sequence, q16, is located at the top of the column defined by UI5. This pattern is repeated across the columns of frame 300.

In some embodiments, the generator polynomial for the 8 bit CRC is $x^8+x^5+x^3+x^2+x+1$. In binary, this polynomial may be represented as 0b0 10010111. In some embodiments, the host (e.g., host 110, shown in FIG. 1) may generate a CRC checksum and may form the write data frames using an appropriate functional equivalent for the following algorithm (e.g., for frames that include data mask bits):

1) Set Q[71:0]={DM[7:0]. q[63:0]}
2) Set CRC[7:0]=the remainder when Q[71:0] is divided by 0b0 10010111.

The first stage of the algorithm, places the data mask bits into the most significant bits (MSB's) of the write data frame. These bits can be zeroed. The data may be placed into the remaining bit locations (e.g., the least significant bits) which are not zeroed. In alternative embodiments, a different algorithm may be used.

The DRAM receives the code word (e.g., Q[71:0]) generated by the host. In some embodiments, the DRAM checks for an error in the received code word using an appropriate functional equivalent to the following algorithm:

3) Set R[7:0]=the remainder when Q[71:0] is divided by 0b0 10010111.
4) If R[7:0]≠CRC[7:0] the received code word contains one or more errors.
5) Error reported using an ERROR signal from DRAM.

The first stage (step #3) generates a "local checksum" based on the received code word. The local checksum is compared with the received checksum (e.g., the checksum generated at step #2). If an error is detected, the DRAM may provide an error signal to the host (e.g. step #5). In alternative embodiments, a different algorithm may be used.

In some embodiments, CRC XOR equations based on the generator polynomial $x^8+x^5+x^3+x^2+x+1$ are as follows: 0x97 $p(x)=(x+1)(x^7+x^6+x^5+x^2+1)$. In VHDL equation format with D(71) and CRC(7) being the most significant bits, the XOR equations may be expressed as follows.

$CRC(0) := D(70)$ xor $D(69)$ xor $D(67)$ xor $D(64)$ xor $D(63)$ xor $D(61)$ xor $D(59)$ xor $D(58)$ xor $D(54)$ xor $D(53)$ xor $D(51)$ xor $D(50)$ xor $D(49)$ xor $D(46)$ xor $D(45)$ xor $D(44)$ xor $D(42)$ xor $D(38)$ xor $D(37)$ xor $D(36)$ xor $D(35)$ xor $D(33)$ xor $D(32)$ xor $D(31)$ xor $D(30)$ xor $D(27)$ xor $D(25)$ xor $D(24)$ xor $D(23)$ xor $D(22)$ xor $D(21)$ xor $D(15)$ xor $D(12)$ xor $D(11)$ xor $D(10)$ xor $D(9)$ xor $D(8)$ xor $D(7)$ xor $D(5)$ xor $D(3)$ xor $D(0)$;

$CRC(1) := D(71)$ xor $D(69)$ xor $D(68)$ xor $D(67)$ xor $D(65)$ xor $D(63)$ xor $D(62)$ xor $D(61)$ xor $D(60)$ xor $D(58)$ xor $D(55)$ xor $D(53)$ xor $D(52)$ xor $D(49)$ xor $D(47)$ xor $D(44)$ xor $D(43)$xor $D(42)$ xor $D(39)$ xor $D(35)$ xor $D(34)$ xor $D(30)$ xor $D(28)$ xor $D(27)$ xor $D(26)$ xor $D(21)$ xor $D(16)$ xor $D(15)$ xor $D(13)$ xor $D(7)$ xor $D(6)$ xor $D(5)$ xor $D(4)$ xor $D(3)$ xor $D(1)$ xor $D(0)$;

$CRC(2) := D(68)$ xor $D(67)$ xor $D(66)$ xor $D(62)$ xor $D(58)$ xor $D(56)$xor $D(51)$ xor $D(49)$ xor $D(48)$ xor $D(46)$ xor $D(43)$ xor $D(42)$ xor $D(40)$ xor $D(38)$ xor $D(37)$ xor $D(33)$ xor $D(32)$ xor $D(30)$ xor $D(29)$ xor $D(28)$ xor $D(25)$ xor $D(24)$ xor $D(23)$ xor $D(21)$ xor $D(17)$ xor $D(16)$ xor $D(15)$ xor $D(14)$ xor $D(12)$ xor $D(11)$ xor $D(10)$ xor $D(9)$ xor $D(6)$ xor $D(4)$ xor $D(3)$ xor $D(2)$ xor $D(1)$ xor $D(0)$;

$CRC(3) := D(70)$ xor $D(68)$ xor $D(64)$ xor $D(61)$ xor $D(58)$ xor $D(57)$ xor $D(54)$ xor $D(53)$ xor $D(52)$ xor $D(51)$ xor $D(47)$ xor $D(46)$ xor $D(45)$ xor $D(43)$ xor $D(42)$ xor $D(41)$ xor $D(39)$ xor $D(37)$ xor $D(36)$ xor $D(35)$ xor $D(34)$ xor $D(32)$ xor $D(29)$ xor $D(27)$ xor $D(26)$ xor $D(23)$ xor $D(21)$ xor $D(18)$ xor $D(17)$ xor $D(16)$ xor $D(13)$ xor $D(9)$ xor $D(8)$ xor $D(4)$ xor $D(2)$ xor $D(1)$ xor $D(0)$;

$CRC(4) := D(71)$ xor $D(69)$ xor $D(65)$ xor $D(62)$ xor $D(59)$ xor $D(58)$ xor $D(55)$ xor $D(54)$ xor $D(53)$ xor $D(52)$ xor $D(48)$ xor $D(47)$ xor $D(46)$ xor $D(44)$ xor $D(43)$ xor $D(42)$ xor $D(40)$ xor $D(38)$ xor $D(37)$ xor $D(36)$ xor $D(35)$ xor $D(33)$ xor $D(30)$ xor $D(28)$ xor $D(27)$ xor $D(24)$ xor $D(22)$ xor $D(19)$ xor $D(18)$ xor $D(17)$ xor $D(14)$ xor $D(10)$ xor $D(9)$ xor $D(5)$ xor $D(3)$ xor $D(2)$ xor $D(1)$;

$CRC(5) := D(69)$ xor $D(67)$ xor $D(66)$ xor $D(64)$ xor $D(61)$ xor $D(60)$ xor $D(58)$ xor $D(56)$ xor $D(55)$ xor $D(51)$ xor $D(50)$ xor $D(48)$ xor $D(47)$ xor $D(46)$ xor $D(43)$ xor $D(42)$ xor $D(41)$ xor $D(39)$ xor $D(35)$ xor $D(34)$ xor $D(33)$ xor $D(32)$ xor $D(30)$ xor $D(29)$ xor $D(28)$ xor $D(27)$ xor $D(24)$ xor $D(22)$ xor $D(21)$ xor $D(20)$ xor $D(19)$ xor $D(18)$ xor $D(12)$ xor $D(9)$ xor $D(8)$ xor $D(7)$ xor $D(6)$ xor $D(5)$ xor $D(4)$ xor $D(2)$ xor $D(0)$;

-continued $CRC(6) := D(70)$ xor $D(68)$ xor $D(67)$ xor $D(65)$ xor $D(62)$ xor $D(61)$ xor $D(59)$ xor $D(57)$ xor $D(56)$ xor $D(52)$ xor $D(51)$ xor $D(49)$ xor $D(48)$ xor $D(47)$ xor $D(44)$ xor $D(43)$ xor $D(42)$ xor $D(40)$ xor $D(36)$ xor $D(35)$ xor $D(34)$ xor $D(33)$ xor $D(31)$ xor $D(30)$ xor $D(29)$ xor $D(28)$ xor $D(25)$ xor $D(23)$ xor $D(22)$ xor $D(21)$ xor $D(20)$ xor $D(19)$ xor $D(13)$ xor $D(10)$ xor $D(9)$ xor $D(8)$ xor $D(7)$ xor $D(6)$ xor $D(5)$ xor $D(3)$ xor $D(1)$;

$CRC(7) := D(71)$ xor $D(69)$ xor $D(68)$ xor $D(66)$ xor $D(63)$ xor $D(62)$ xor $D(60)$ xor $D(58)$ xor $D(57)$ xor $D(53)$ xor $D(52)$ xor $D(50)$ xor $D(49)$ xor $D(48)$ xor $D(45)$ xor $D(44)$ xor $D(43)$ xor $D(41)$ xor $D(37)$ xor $D(36)$ xor $D(35)$ xor $D(34)$ xor $D(32)$ xor $D(31)$ xor $D(30)$ xor $D(29)$ xor $D(26)$ xor $D(24)$ xor $D(23)$ xor $D(22)$ xor $D(21)$ xor $D(20)$ xor $D(14)$ xor $D(11)$ xor $D(10)$ xor $D(9)$ xor $D(8)$ xor $D(7)$ xor $D(6)$ xor $D(4)$ xor $D(2)$;

FIG. 4 illustrates selected aspects of a ×4 frame with cyclic redundancy code bits, according to an embodiment of the invention. Frame 400 conveys data bits in the first eight UI (UI0 through UI7).). It also conveys CRC bits in UI 8 and UI 9. In the illustrated embodiment, frame 400 does not include data mask bits because, in many cases, ×4 devices do not support data masking as they are primarily used in servers that have error correction code (ECC) and perform a "read-modify-write" operation. The data bits in frame 400 are mapped in a serpentine pattern across the columns of frame 400 to increase the effectives of the coverage provided by the CRC bits.

Figure 5:
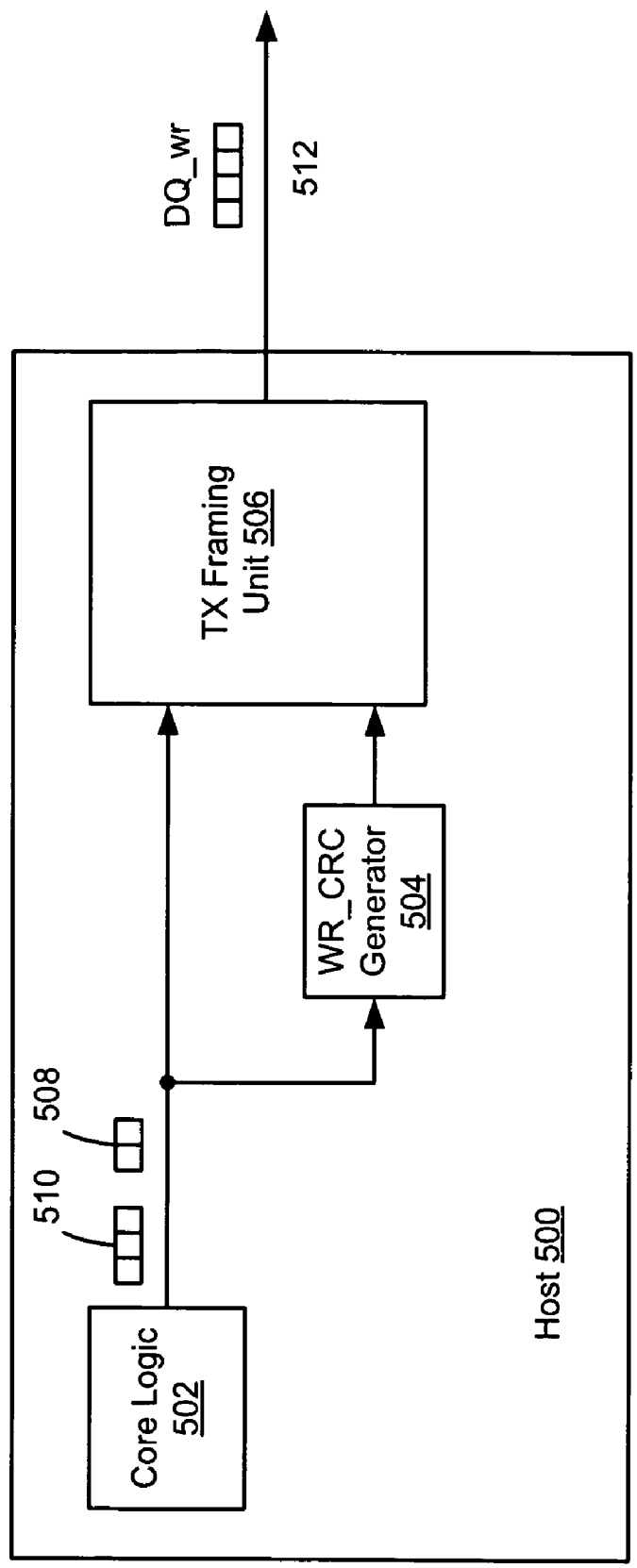
FIG. 5 is a block diagram illustrating selected aspects of a write data path for a host implemented according to an embodiment of the invention.

FIG. 5 is a block diagram illustrating selected aspects of a write data path for a host implemented according to an embodiment of the invention. Host 500 includes, inter alia, core logic 502, CRC generator 504, and transmit (TX) framing unit 506. In alternative embodiments, host 500 includes more elements, fewer elements, and/or different elements. Core logic 502 includes, for example, scheduling logic to schedule reads and writes to main memory as well as retry logic to retry operations when a transmission error occurs. In addition, core logic 502 includes logic to generate data mask bits 508 to mask at least some of the corresponding write data bits 510.

In operation, core logic 502 schedules, for example, a partial write operation and provides the write data (510) and the corresponding data mask bits (508) to TX framing unit 506 and to CRC generator 504. In some embodiments, CRC generator 504 generates a CRC checksum based on the write data and the data mask bits. A wide array of CRC algorithms may be employed including, for example, an algorithm in which six levels of XOR trees are used to compute the CRC checksum. In alternative embodiments, a different number of XOR trees or a different algorithm may be used to generate the CRC checksum. In some embodiments, the write data path and the read data path use the same XOR trees to generate the CRC checksum.

TX framing unit 506 frames the write data (510), the data mask bits (508) and the corresponding CRC checksum into one or more write data frames (e.g., write data frame 512). In some embodiments, TX framing unit 506 is capable of generating different frame types depending on factors such as whether CRC is enabled and the width of the DRAM. For example, TX framing unit 506 may be capable of generating a first frame type which includes a CRC8, 64 data bits, and 8 data mask bits (e.g., for a ×8 device). TX framing unit 506 may also be capable of generating a second frame type having a CRC8 and 64 data bits (e.g., for a ×8 device). If host 500 is coupled with a ×4 device, then it may support a third frame type having a CRC8 over 32 bits. In alternative embodiments, more frame types, fewer frame types, and/or different frame types may be supported. The write data frame(s) (512) is transferred to one or more memory devices (e.g., DRAMs) via the DQ bus.

Figure 6:
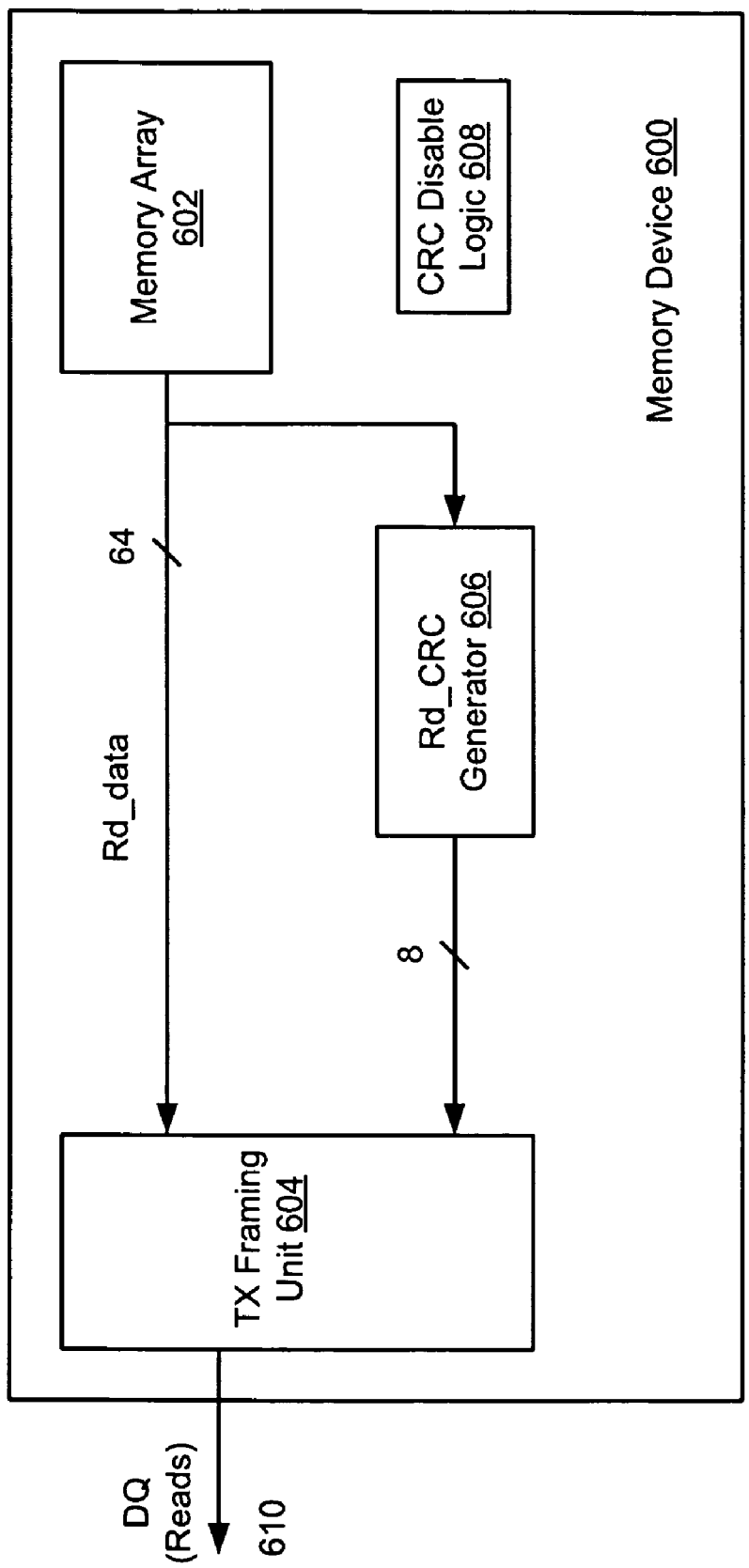
FIG. 6 is a block diagram illustrating selected aspects of a read data path for a memory device implemented according to an embodiment of the invention.

FIG. 6 is a block diagram illustrating selected aspects of a read data path for a memory device implemented according to an embodiment of the invention. Memory device 600 includes, inter alia, memory array 602, transmit (TX) framing unit 604, CRC generator 606, and CRC disable logic 608. In alternative embodiments, memory device 600 may include more elements, fewer elements, and/or different elements. In some embodiments, memory device 600 is a dynamic random access memory device (DRAM).

In operation, memory device 600 receives a read command from the host (e.g., host 110) on a C/A bus (e.g., C/A bus 102). The data is read from memory array 602 and provided to TX framing unit 604. The read data is also provided to CRC generator 606 which computes a CRC checksum. In some embodiments, six levels of XOR trees are used to compute the CRC checksum. In alternative embodiments, a different number of XOR trees or a different algorithm may be used to generate the CRC checksum. In some embodiments, the read data path and the write data path use the same XOR trees to generate the CRC checksum.

TX framing unit 604 receives the read data bits and the checksum bits and frames them in a write data frame. In some embodiments, TX framing unit 604 is capable of using different frame types depending, for example, on whether CRC is enabled. For example, TX framing unit 604 may use a first frame type if CRC is enabled and a second frame type if CRC is disabled. The first frame type may include both read data bits and a corresponding CRC checksum. The second frame type may include the read data bits without the CRC checksum. Memory device 600 may transfer the read data frames (with or without a CRC checksum) to the host via DQ bus 610.

Memory device 600 includes CRC disable logic 608. In some embodiments, CRC disable logic 608 disables the use of a CRC by memory device 600. Thus, in some embodiments, memory device 600 can be configured to use a CRC checksum with read data or configured to not use a CRC checksum with read data (and/or with write data). In some embodiments, CRC disable logic includes a portion of a mode register set (MRS).

Figure 7:
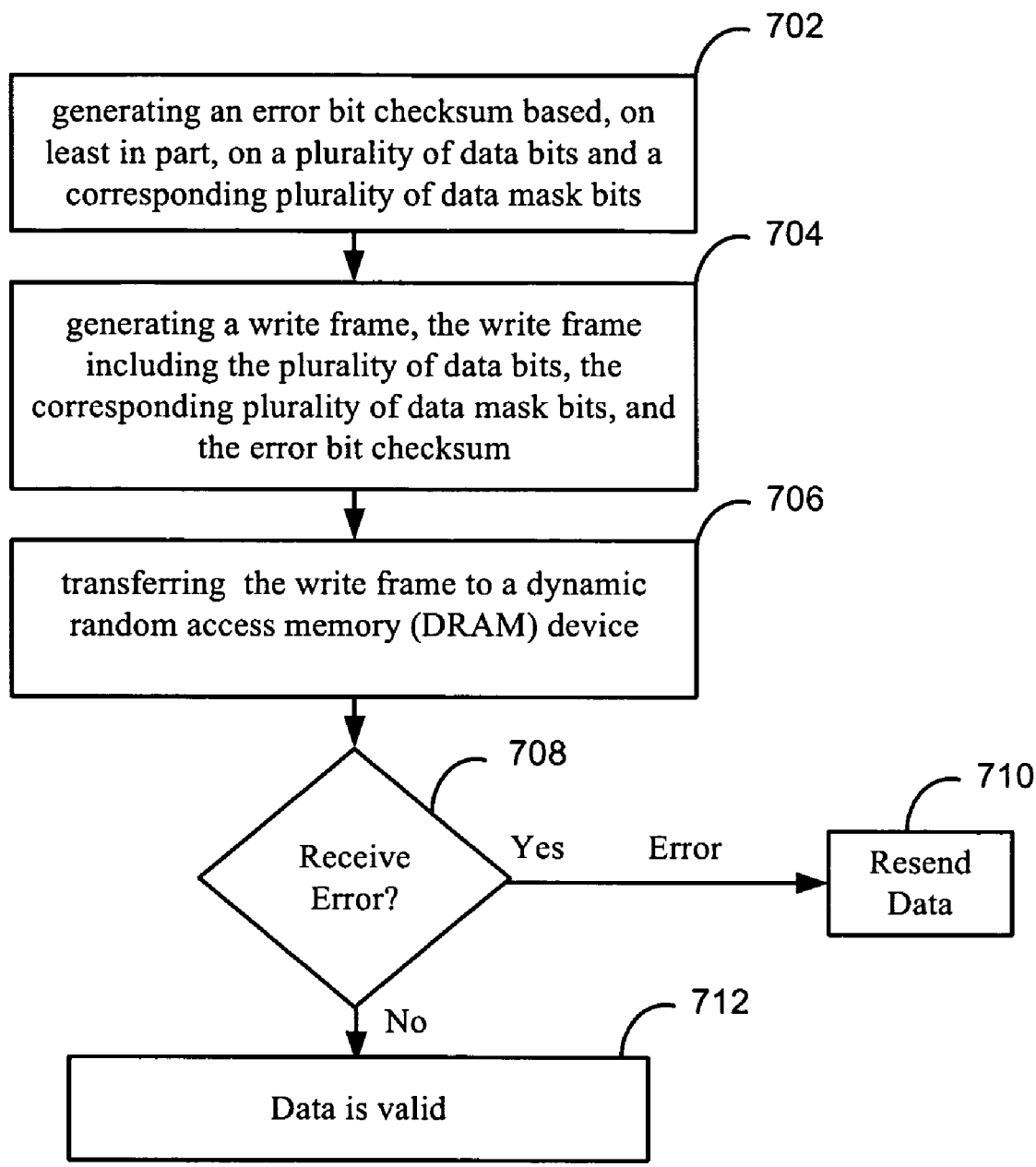
FIG. 7 is a flow diagram illustrating selected aspects of a method for transferring data and data mask bits in a common frame with a shared error bit checksum, according to an embodiment of the invention.

FIG. 7 is a flow diagram illustrating selected aspects of a method for transferring data and data mask bits in a common frame with a shared error bit checksum, according to an embodiment of the invention. Referring to process block 702, a host (e.g., a memory controller) generates an error bit checksum (e.g., a CRC checksum) to cover transmission errors for a plurality of data bits and to cover (e.g., for a partial write operation) one or more data mask bits. In some embodiments, the host includes a CRC generator to generate the CRC checksum. The host may use the same CRC tree for the read data path and the write data path.

Referring to process block 704, the host (using, e.g., transmit framing unit 506, shown in FIG. 5) frames the plurality of data bits into one or more data frames. In some embodiments, the host can generate different frame types depending on whether CRC is enabled and/or whether a partial write or a full write is being performed. The one or more data frames are transferred to a memory device (e.g., a DRAM) via a data bus at 706.

In some embodiments, the DRAM uses the CRC checksum included in the frame provided by the host to determine whether a transmission error has occurred. For example, the DRAM may generate a "local" CRC checksum (based on the received data) and compare the local checksum with the received checksum. If a transmission error has occurred, the DRAM may send an error signal to the host. Referring to decision block 708, if the host receives an error signal, then it may resend the data (at 710). Alternatively, if the host does not receive an error signal, then the data may be valid (at 712).

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the description above, certain terminology is used to describe embodiments of the invention. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a microcontroller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An integrated circuit comprising:
    logic to indicate whether error bit coverage is enabled for a frame to be transferred from the integrated circuit to a memory device;
    error bit generation logic to generate an error bit checksum based on a plurality of data bits and a corresponding plurality of data mask bits to cover the frame, if error bit coverage is enabled, wherein the data mask bits are utilized in a partial write operation in which at least some of the write data is masked using one or more data mask bits; and
    framing logic to generate the frame, wherein the framing logic is capable of generating the frame based on a number of different frame types, including a first frame type, the first frame type having a plurality of data bits, a plurality of data mask bits, and a corresponding error bit checksum.

2. The integrated circuit of claim 1, wherein the frame is based on the first frame type.

3. The integrated circuit of claim 2, wherein the data mask bits, DM, are located in the most significant bit locations of the frame (Q).

4. The integrated circuit of claim 3, wherein the error bit logic generates a checksum, C, based, at least in part, on dividing Q by a cyclic redundancy code (CRC) generator polynomial.

5. The integrated circuit of claim 4, wherein C includes the remainder when Q is divided by the CRC generator polynomial.

6. The integrated circuit of claim 5, wherein the CRC generator polynomial is represented in binary by the expression 0b0 10010111.

7. The integrated circuit of claim 6, wherein the frame is to be transferred to a ×8 dynamic random access memory (DRAM) device and Q is based, at least in part, on the following expression: $Q[71:0]=\{DM[7:0]. q[63:0]\}$.

8. The integrated circuit of claim 7, wherein C is the remainder when Q[71:0] is divided by 0b0 10010111.

9. The integrated circuit of claim 1, wherein the framing logic is capable of generating the frame based on a second frame type, the second frame type including a plurality of data bits and a corresponding error bit checksum.

10. The integrated circuit of claim 9, wherein the frame is based on the second frame type and the memory device is a ×4 dynamic random access memory (DRAM) device.

11. The integrated circuit of claim 10, wherein bits [71:32] of the frame, Q, are set to zero.

12. The integrated circuit of claim 11, wherein the checksum, C, is the remainder when Q[71:0] is divided by 0b10010111.

13. The integrated circuit of claim 1, further comprising:
    frame length control logic to determine a length for a frame transferred between the integrated circuit and the memory device.

14. The integrated circuit of claim 13, wherein, for a read transaction, the frame length control logic specifies a frame length of N unit intervals (UI), if error bit coverage is enabled, and specifies a frame length of M UI, if error bit coverage is not enabled.

15. The integrated circuit of claim 13, wherein, for a write transaction, the frame length control logic specifies a frame length of N unit intervals (UI), if error bit coverage is enabled.

16. The integrated circuit of claim 15, wherein, for a write transaction, the frame length control logic specifies a frame length of N UI for a full write frame and M UI for a partial right frame, if error bit coverage is not enabled.

17. The integrated circuit of claim 13, wherein N is ten and M is eight.

18. The integrated circuit of claim 1, wherein the integrated circuit includes a memory controller.

19. A method comprising:
    generating an error bit checksum based, on least in part, on a plurality of data bits and a corresponding plurality of data mask bits, wherein the data mask bits are utilized in a partial write operation in which at least some of the write data is masked using one or more data mask bits; and
    generating a write frame, the write frame including the plurality of data bits, the corresponding plurality of data mask bits, and the error bit checksum.

20. The method of claim 19, wherein the write frame is to be transferred to a ×8 dynamic random access memory (DRAM) device and Q is based, at least in part, on the following expression $Q[71:0]=\{DM[7:0]. q[63:0]\}$.

21. The method of claim 20, wherein the error bit checksum, C, is the remainder when Q[71:0] is divided by 0b0 10010111.

22. A system comprising:
    a host, the host including logic to indicate whether cyclic redundancy code (CRC) coverage is enabled for a frame to be transferred from the host to a dynamic random access memory (DRAM) device, CRC generation logic to generate a CRC checksum based on a plurality of data bits and a corresponding plurality of data mask bits to cover the frame, if CRC coverage is enabled, wherein the data mask bits are utilized in a partial write operation in which at least some of the write data is masked using one or more data mask bits, and framing logic to generate the frame, wherein the framing logic is capable of generating the frame based on a number of different frame types, including a first frame type, the first frame type having a plurality of data bits, a plurality of data mask bits, and a corresponding CRC checksum; and
    the DRAM device coupled with the host.

23. The system of claim 22, wherein the DRAM device includes CRC generation logic to generate a local CRC checksum based, at least in part, on dividing the frame by a CRC generator polynomial; comparison logic to compare the local CRC checksum with the CRC checksum; and error reporting logic to provide an error indication, if the local CRC checksum does not match the CRC checksum.

24. The system of claim 23, wherein the frame is based on the first frame type.

25. The system of claim 24, wherein the data mask bits, DM, are located in the most significant bit locations of the frame (Q).

26. The system of claim 25, wherein the error bit logic generates a checksum, C, based, at least in part, on dividing Q by a cyclic redundancy code (CRC) generator polynomial.

27. The system of claim 26, wherein C includes the remainder when Q is divided by the CRC generator polynomial.

28. The system of claim 27, wherein the CRC generator polynomial is represented in binary by the expression 0b0 10010111.

29. The system of claim 28, wherein the frame is to be transferred to a ×8 dynamic random access memory (DRAM) device and Q is based, at least in part, on the following expression $Q[71:0]=\{DM[7:0]. q[63:0]\}$.

* * * * *